United States Patent [19]
Hashimoto

[11] Patent Number: 6,027,839
[45] Date of Patent: Feb. 22, 2000

[54] METHOD FOR TRANSFERRING PATTERN IMAGES THROUGH MIX-AND-MATCH EXPOSURE AT IMPROVED OVERLAY ACCURACY

[75] Inventor: Takeo Hashimoto, Tokyo, Japan

[73] Assignee: NEC Corporation, Tokyo, Japan

[21] Appl. No.: 09/192,940

[22] Filed: Nov. 16, 1998

[30] Foreign Application Priority Data

Nov. 18, 1997 [JP] Japan ................................. 9-316930

[51] Int. Cl.⁷ ...................................................... G03F 9/00
[52] U.S. Cl. ............................................. 430/22; 430/312
[58] Field of Search .............................. 430/22, 312, 328

[56] References Cited

U.S. PATENT DOCUMENTS 5,731,113  3/1998  Ueno ........................................ 430/312

*Primary Examiner*—Christopher G. Young
*Attorney, Agent, or Firm*—Young & Thompson

[57] ABSTRACT

A scanning reduction projection aligner has an image field twice wider than an image field of a stepping reduction production aligner, and plural first latent images and plural second latent images are formed in a first photo resist layer and a second photo resist layer spread over a semiconductor wafer in different phases of a fabrication process of a semiconductor device by using the stepping reduction projection aligner and the scanning reduction projection aligner, respectively; when the first latent images are formed in the first photo resist layer, narrow areas of the first photo resist layer are aligned with a reticle by using an alignment mark on the semiconductor wafer at every other pattern transfer so that each second latent image is exactly superimposed on one of the pairs of first latent images in spite of incorrect perpendicularity of orthogonal coordinates virtually determined over the semiconductor wafer.

7 Claims, 8 Drawing Sheets

METHOD FOR TRANSFERRING PATTERN IMAGES THROUGH MIX-AND-MATCH EXPOSURE AT IMPROVED OVERLAY ACCURACY

FIELD OF THE INVENTION

This invention relates to a photo-lithography and, more particularly, to a method for transferring pattern images to a photo-sensitive layer spread over a semiconductor wafer by using a mix-and-match exposure.

DESCRIPTION OF THE RELATED ART

The photo-lithography is popular to manufacturers who fabricate circuit components of an integrated circuit on a semiconductor wafer. While the manufacturer is fabricating the circuit components on the semiconductor wafer, the photo-lithography is repeated for transferring pattern images to photo-sensitive layers over the semiconductor wafer. Users expect an integrated circuit to achieve complicated functions, and the manufacturers have been increased the circuit components of the integrated circuit so as to cope with the complicated functions. In order to integrate a large number of circuit components on a single semiconductor chip, the manufacturer miniaturizes the circuit components, and enlarges the semiconductor chip. The photo-lithography is expected to exactly transfer a miniature pattern to wide area of a photo-sensitive layer.

A stepping reduction projection aligner is a typical apparatus used for a pattern transfer. The stepping reduction projection aligner stepwise moves a semiconductor wafer mounted on a movable stage, and repeats a pattern transfer from a reticle to a photo sensitive layer on the semiconductor wafer so as to transfer a pattern image over the photo sensitive layer. The stepping reduction projection aligner is appropriate for a pattern transfer to a photo-sensitive layer on a wide semiconductor wafer. However, when the semiconductor chip is enlarged, it is hard for the stepping reduction projection aligner to transfer a wide pattern image from a large reticle to the photo sensitive layer.

A scanning reduction projection aligner is appropriate for a pattern transfer from the large photo mask. The scanning reduction projection aligner gives rise to a relative motion between a illumination system and the semiconductor wafer/the photo mask at a velocity appropriate for the reduction ratio, and transfers the whole pattern image from the photo mask to the photo sensitive layer through the relative motion. However, the scanning reduction projection aligner consumes a long time period for the pattern transfer, and the throughput is less than that of the stepping reduction projection aligner.

The mix-and-match exposure system is a compromise between the stepping reduction projection aligner and the scanning reduction projection aligner. The scanning reduction projection aligner is usually equipped with a KrF excimer laser source, and the KrF excimer laser source radiate KrF excimer laser light at 248 nanometer wavelength. On the other hand, the stepping reduction projection aligner is usually equipped with a mercury light source, and the mercury light source radiates i-ray at 365 nanometer wavelength. Therefore, the scanning reduction projection aligner is appropriate for a miniature pattern image rather than the stepping reduction projection aligner.

When the scanning reduction projection aligner and the stepping reduction projection aligner form parts of a mix-and-match exposure system, an image field is different in area between the scanning reduction projection aligner and the stepping reduction projection aligner. Although there is a difference in image field among the scanning reduction projection alingers designed by different manufacturers and in the stepping reduction projection aligners designed by different manufacturers, a typical image field measures 25 millimeters by 33 millimeters in the scanning reduction projection aligner and 22 millimeters by 22 millimeters in the stepping reduction projection aligner.

If a manufacturer transfers pattern images to a photo-sensitive layer for a semiconductor chip of 22 millimeters× 16 millimeters through the mix-and-match exposure system, the stepping reduction projection aligner transfers a pattern image for only one semiconductor chip 1 to the image field 2 on the photo-sensitive layer (see FIG. 1), and the scanning reduction projection aligner transfers a pattern image for two semiconductor chips 1 to the image field 3 on the photo-sensitive layer as shown in FIG. 2.

Assuming now that a manufacturer is going to transfer a pattern image to a photo-sensitive layer by using the stepping reduction projection aligner, the manufacturer previously allots the image fields 2 over a semiconductor wafer. The stepping reduction projection aligner firstly determines the location of an alignment mark, and aligns the reticle with a narrow area for one of the image fields 2 with respect to the alignment mark. The mercury lamp of the stepping reduction projection aligner radiates i-ray through the reticle onto the narrow area in a photo sensitive layer spread over the semiconductor wafer, and forms a latent image of the pattern in the narrow area. The stepping reduction projection aligner moves the stage, and aligns the reticle with another narrow are for the next image field 2 also with respect to the alignment mark, and the pattern image is transferred from the reticle to the next area so as to form another latent image. In this way, the stepping reduction projection aligner two-dimensionally moves the stage and, accordingly, the photo-sensitive layer over the semiconductor wafer in orthogonal coordinates virtually determined on the photo-sensitive layer, and sequentially transfers the pattern image onto the photo-sensitive layer. However, if the orthogonal coordinates are incorrect, i.e., x-axis does not cross y-axis at right angle, the image fields 2 are obliquely arranged with respect to x-axis as shown in FIG. 3

After the pattern transfer through the stepping reduction projection aligner, the manufacturer transfers another pattern image to a photo-sensitive layer spread over the semiconductor wafer through the scanning reduction projection aligner. The image field 3 is superimposed on the image fields 2 obliquely arranged along y-axis as shown in FIG. 4. As a result, the pattern image for the semiconductor chips 1 are offset between the image fields 2 and the image field 3.

A scanning reduction projection aligner has a correction capability called as "field skew". The scanning reduction projection reshapes the image field 3 from the rectangular configuration to a parallelogram 4 as shown in FIG. 5. Although the parallelogram image field 4 aligns the upper edge and the lower edge thereof with the upper edge of one image field 2 and the lower edge of the other image field 2, the side edges of the parallelogram image field 4 obliquely extends in parallel to y-axis, and are still spaced from the side edges of the rectangular image field 3. This results in poor overlay accuracy between the pattern image transferred through the stepping reduction projection aligner and the pattern image transferred through the scanning reduction projection aligner. Thus, the manufacturer encounters a problem in the prior art mix-an-match exposure system in the poor overlay accuracy.

SUMMARY OF THE INVENTION

It is therefore an important object of the present invention to provide a method for transferring pattern images through a mix-and-match exposure system, which achieves good overlay accuracy.

The present inventor contemplated the problem inherent in the prior art mix-and-match exposure technology, and noticed that the oblique arrangement was due to the wafer alignment carried out before the pattern transfer to each image field.

To accomplish the object, the present invention proposes to carry out the wafer alignment at each group of narrow image fields corresponding to a wide image field.

In accordance with one aspect of the present invention, there is provided a method for transferring pattern images onto photo sensitive layers over a semiconductor wafer, comprising the steps of placing the semiconductor wafer covered with a first photo sensitive layer on a first stage opposed to a first photo mask both incorporated in a first pattern transfer apparatus having a narrow image field, aligning a first narrow area of the first photo sensitive layer with the first photo mask by using an alignment mark stationary with respect to the semiconductor wafer, transferring a first pattern image from the first photo mask to the first narrow area, aligning a second narrow area of the first photo sensitive layer contiguous to the first narrow area without the alignment mark, transferring the first pattern image from the first photo mask to the second narrow area, repeating the previous two steps, if necessary, preparing a second photo sensitive layer over the semiconductor wafer, placing the semiconductor wafer on a second stage opposed to a second photo mask both incorporated in a second pattern transfer apparatus having a wide image field, aligning a wide area of the second photo sensitive layer located over the first and second narrow areas with the second photo mask by using the alignment mark, and transferring a second pattern image from the second photo mask to the wide area so that the second pattern image is superimposed on the pair of first pattern images already transferred.

The pattern transfer of the second pattern image may be carried out before the pattern transfers of the first pattern image.

BRIEF DESCRIPTION OF THE DRAWINGS

The features and advantages of the method will be more clearly understood from the following description taken in conjunction with the accompanying drawings in which.

DESCRIPTION OF THE PREFERRED EMBODIMENTS

First Embodiment

Figure 1:
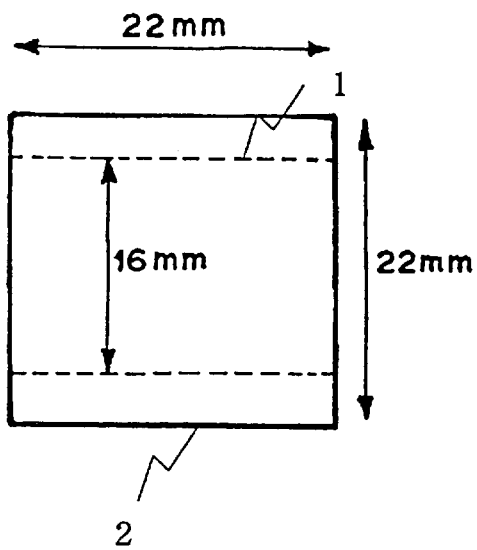
FIG. 1 is a view showing the image field of the prior art stepping reduction projection aligner.
Figure 2:
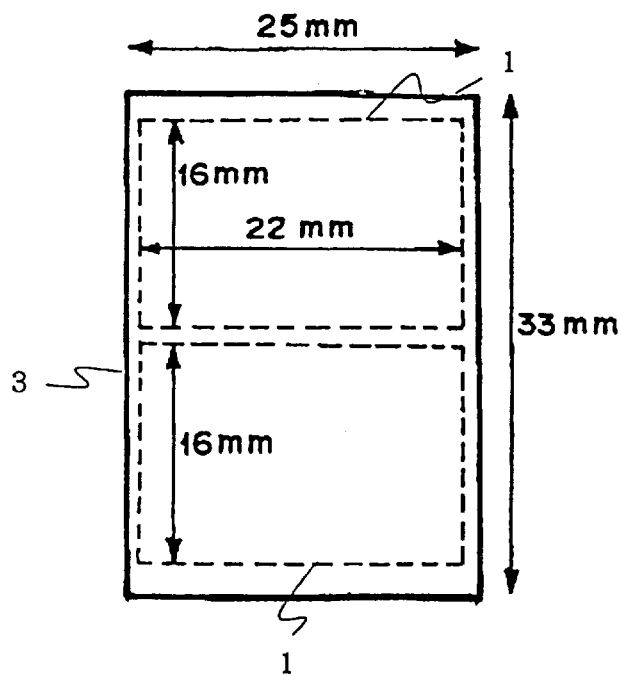
FIG. 2 is a view showing the image field of the prior art scanning reduction projection aligner.
Figure 3:
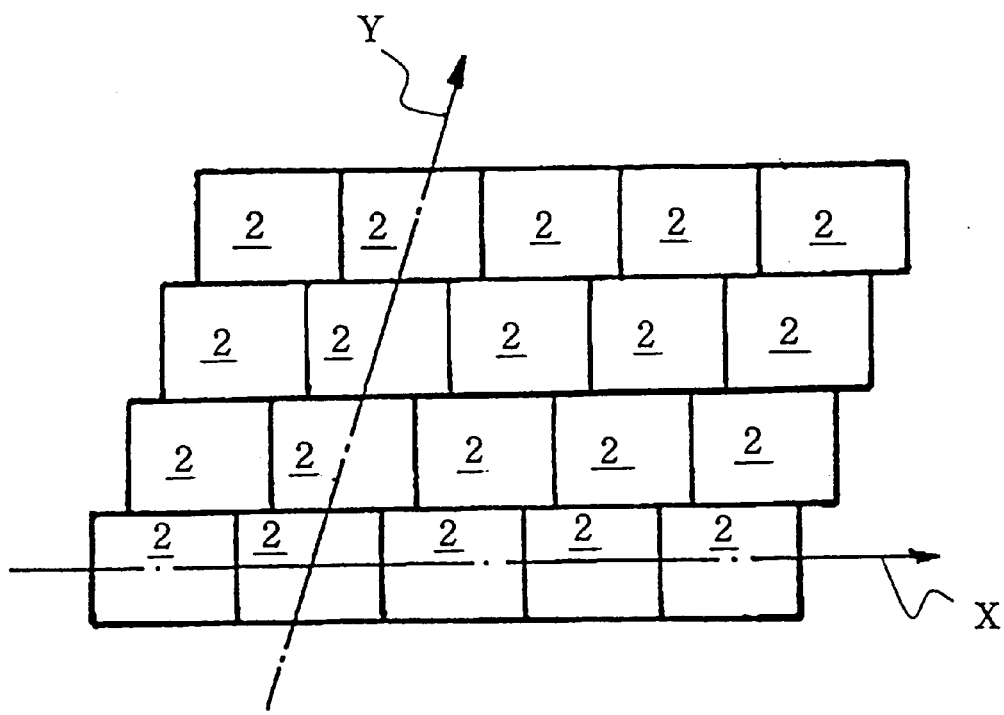
FIG. 3 is a view showing the allocation of the image fields transferred by the prior art stepping reduction projection aligner under incorrect orthogonal coordinates X-Y.
Figure 4:
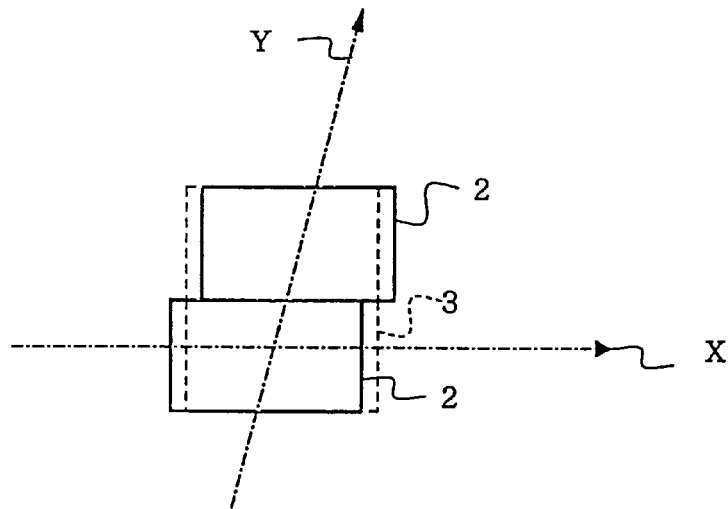
FIG. 4 is a view showing the image field transferred through the prior art scanning reduction projection aligner offset from the image fields transferred through the prior art stepping reduction projection aligner.
Figure 5:
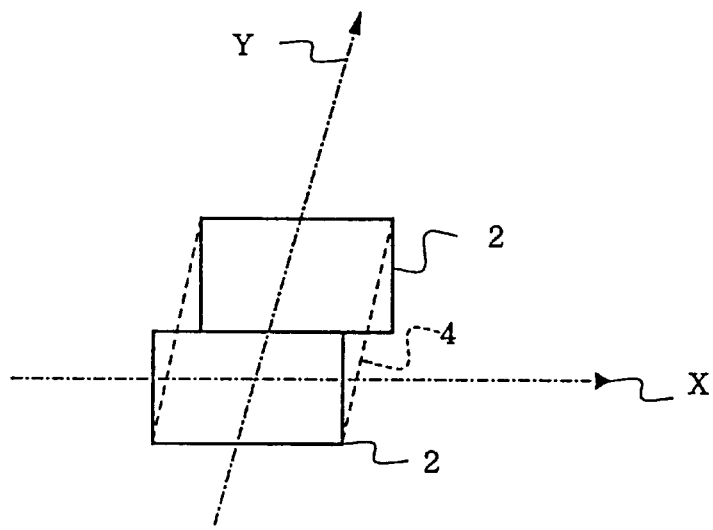
FIG. 5 is a view showing the image field transferred through the prior art scanning reduction projection aligner with the field skew still offset from the image fields transferred through the prior art stepping reduction projection aligner.

A mix-and-match exposure system embodying the present invention includes a standard stepping reduction projection aligner and a standard scanning reduction projection aligner. The standard stepping reduction projection aligner transfers a pattern image from a reticle to narrow area in a photo resist layer spread over a semiconductor wafer mounted on a stage, and moves the stage with respect to the reticle. The standard stepping reduction projection aligner repeats the pattern transfer and the movement so as to form latent images over the photo resist layer. On the other hand, the standard scanning reduction projection aligner synchronously moves a stage and a reticle with respect to an optical beam at a certain velocity appropriate for the reduction ratio, and transfers a pattern image to a photo resist layer spread over the semiconductor wafer. The structures and the pattern transfer sequences of these aligners are known to persons skilled in the art, and no further description is incorporated hereinbelow for the same of simplicity.

FIGS. 6A to 6F illustrate a method for transferring pattern images to photo resist layers according to the present invention. In the following description, a semiconductor chip, an image field of the stepping reduction projection aligner and an image field of the scanning reduction projection aligner are assumed to measure 22 millimeters (in x direction) by 15 millimeters (in y direction), 22 millimeters by 22 millimeters and 25 millimeters by 33 millimeters, respectively. The x direction and the y direction are in parallel to x-axis and y-axis of orthogonal coordinates described hereinbelow. The orthogonal coordinates are assumed to have x-axis and y-axis which do not cross at right angle as similar to the prior art mix-and-match exposure system.

Firstly, photo resist solution is spread over a semiconductor wafer 11, and is baked so as to form a photo resist layer 12. The semiconductor wafer 11 is placed on a movable stage 13 of the stepping reduction projection aligner. An optical detector 14 detects an alignment mark 15 formed on the semiconductor wafer 11, and supplies a piece of positional information to a controller 16. The controller 16 determines the location of the alignment mark 15 in the orthogonal coordinates x-y virtually determined over the semiconductor wafer 11. The manufacturer has already given pieces of data information representative of an allotment of image fields to the controller 16. In this instance, the image fields are arranged in a lattice.

Figure 6A:
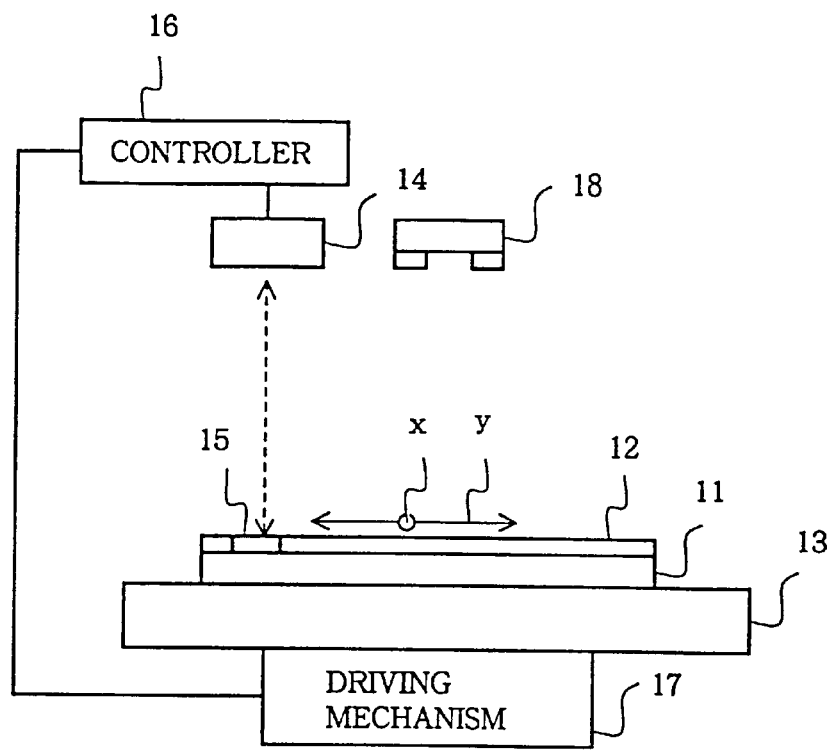
FIGS. 6A to 6F are schematic views showing a method for transferring pattern images to photo resist layers according to the present invention.

Subsequently, the controller 16 determines the location of a first narrow area of the photo resist layer 12 in the orthogonal coordinates x-y, and instructs the driving mechanism 17 to align the first narrow area with a reticle 18 as shown in FIG. 6A.

Figure 6B:
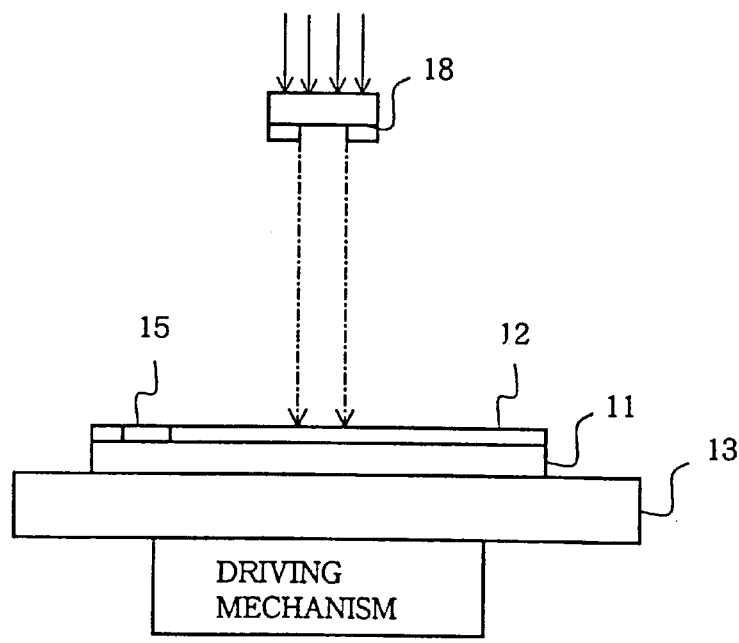
Figure 7:
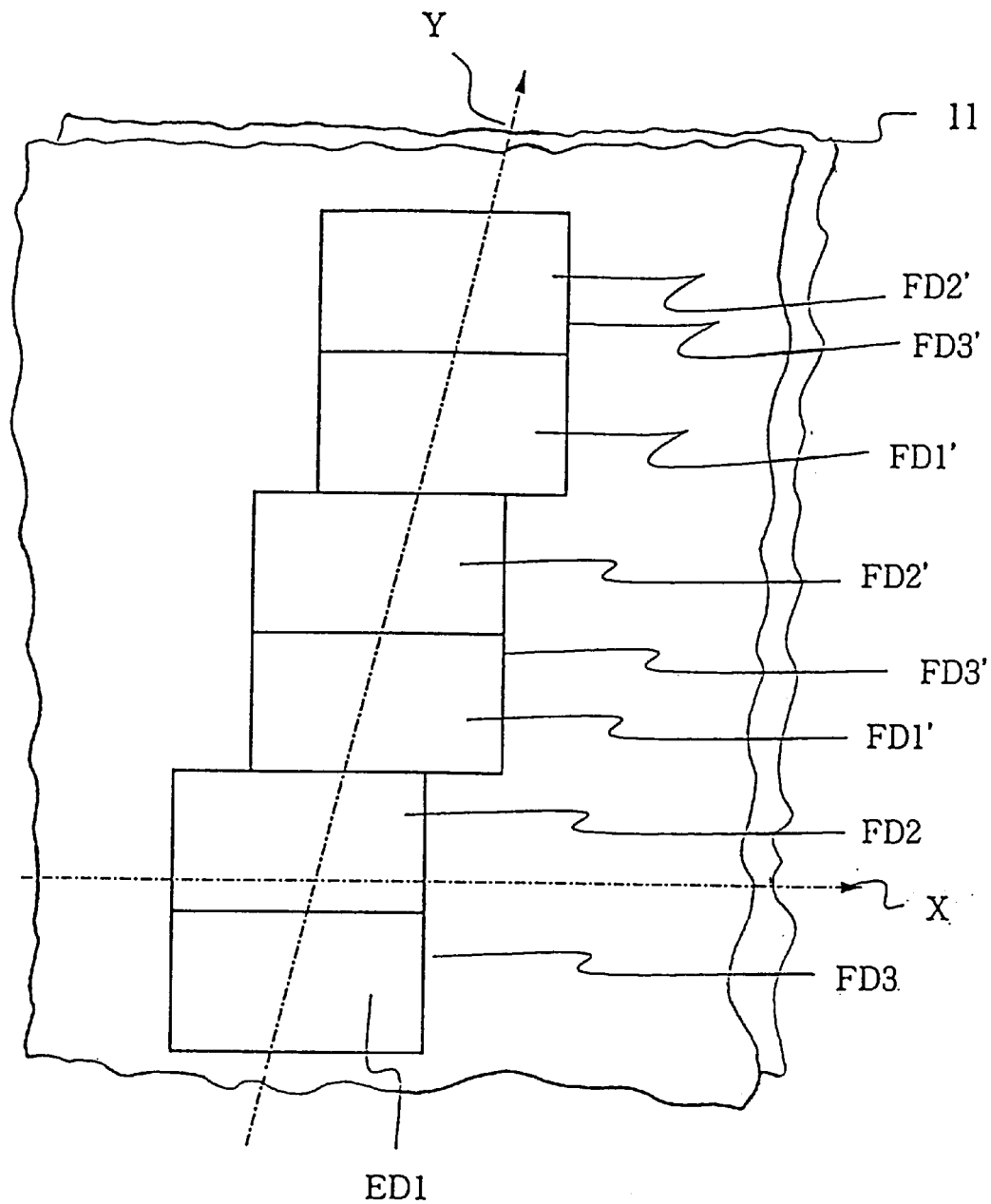
FIG. 7 is a view showing an image field transferred through a scanning reduction projection aligner aligned with image fields transferred through a stepping reduction projection aligner.

When the first narrow area is aligned with the reticle 18, the controller 16 instructs a mercury lamp (not shown) to radiate i-ray through the reticle 18 onto the first narrow area as shown in FIG. 6B. The i-ray transfers the pattern image on the reticle 18 to the first narrow area, and forms a latent image in the first narrow area. The first narrow area is corresponding to an image field FD1 of the stepping reduction projection aligner as shown in FIG. 7.

Figure 6C:
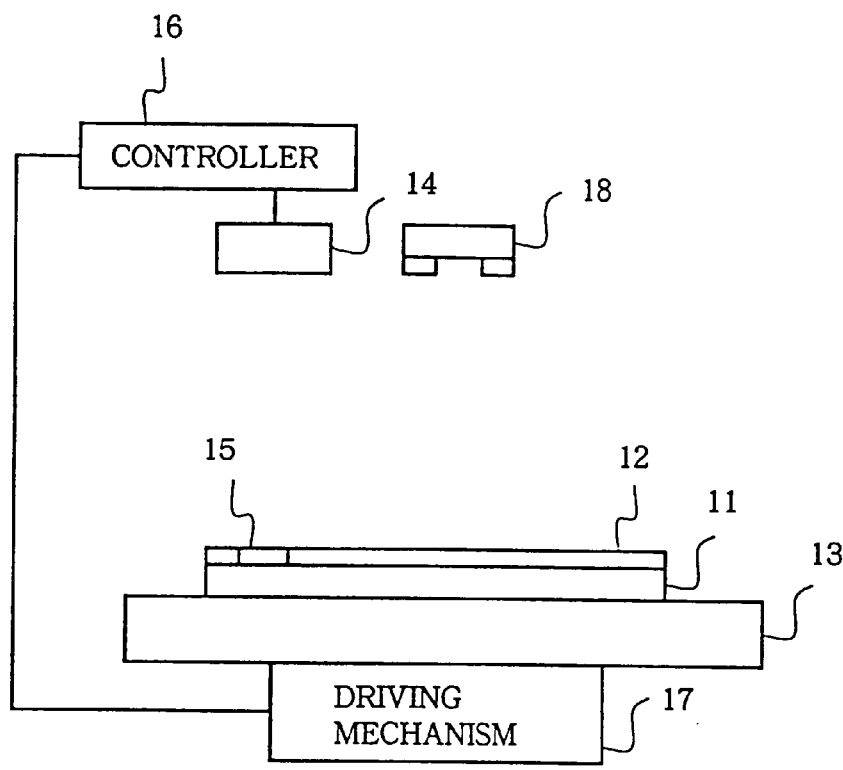
Figure 6D:
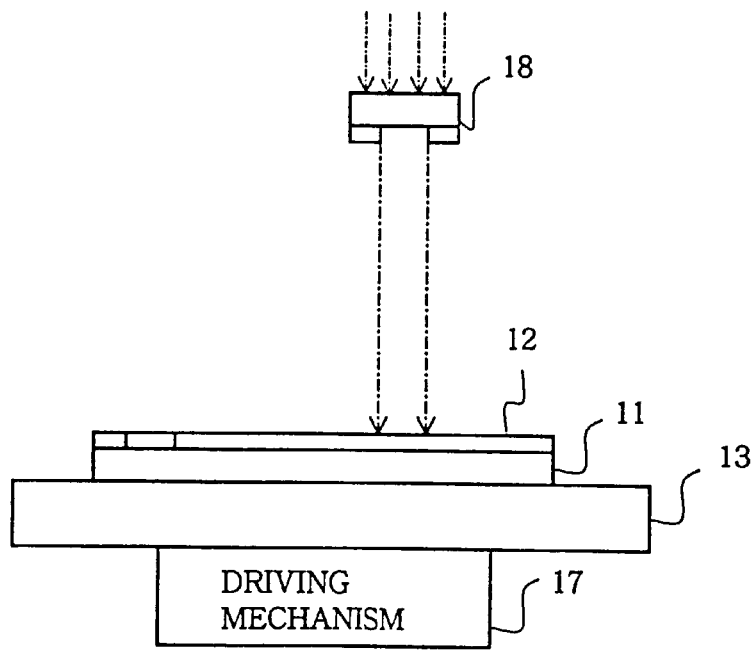

Subsequently, the controller 16 calculates the location of a second narrow area next to the first narrow area spaced in the y direction. Thus, the controller 16 determines the location of the second narrow area without any detection of the alignment mark 15. For this reason, the position of the second narrow area is the driving mechanism 17 moves the stage 13 so as to align the reticle 118 with the second narrow area as shown in FIG. 6C. The controller 16 instructs the mercury lamp to radiate i-ray through the reticle 18 to the second narrow area, and the i-ray forms the latent image in the second narrow area as shown in FIG. 6D. The second narrow area is corresponding to an image field FD2 shown in FIG. 7. The controller 16 determines the location of the second narrow area without detection of the alignment mark, and, accordingly, the location of the second narrow area is never affected by the incorrect orthogonal coordinates. For this reason, the side lines of the image field FD2 are exactly aligned with the side lines of the image field FD1, and the image fields FD1/FD2 form a wide rectangle.

The manufacturer repeats a pattern transfer sequence having the wafer alignment using the alignment mark 15 (see FIG. 6A), the pattern transfer (see FIG. 6B), the wafer alignment without the alignment mark 15 (see FIG. 6C) and the pattern transfer (see FIG. 6D). When the manufacturer carries out the wafer alignment for a narrow area FD1' by using the alignment mark 15, the location of the narrow area FD1' is affected by the incorrect orthogonal coordinates, and the narrow areas FD1/FD1' are obliquely arranged in the y-direction. However, when the manufacturer carries out the wafer alignment for a narrow area FD2' without the detection of alignment mark 15, the location of the narrow area FD2' is free from the incorrect orthogonal coordinates, and the narrow area FD2/FD2' is contiguous to the narrow area FD1/FD1' without offset. As a result, the pairs of narrow areas are obliquely arranged as shown in FIG. 7.

When the latent images are formed over the photo resist layer 12, the manufacturer bakes the photo resist layer, and the latent images are developed in appropriate developing solution. The photo resist layer 12 is formed into a photo resist mask on the semiconductor wafer 11. Using the photo resist mask, the manufacturer carries out an etching, an ion-implantation or another process step.

Thereafter, the manufacturer carries out a pattern transfer through the scanning reduction projection aligner. The manufacturer spreads photo resist solution over a target layer 21 already deposited on the semiconductor wafer 11, and the photo resist solution is baked so as to form a photo resist layer 22. The semiconductor wafer is placed on a stage 23 of the scanning reduction projection aligner, and an optical detector 24 detects the alignment mark 15. The optical detector 24 supplies a piece of positional information to a controller 25, and the controller 25 determines the location of the alignment mark 15 in orthogonal coordinates x-y virtually determined over the semiconductor wafer 11. The manufacturer has already given pieces of data information representative of an allotment of image fields to the controller 25. In this instance, the image fields are arranged in a lattice, and each image field covers one of the pairs of image fields FD1/FD2 or FD1'/FD2'.

Figure 6E:
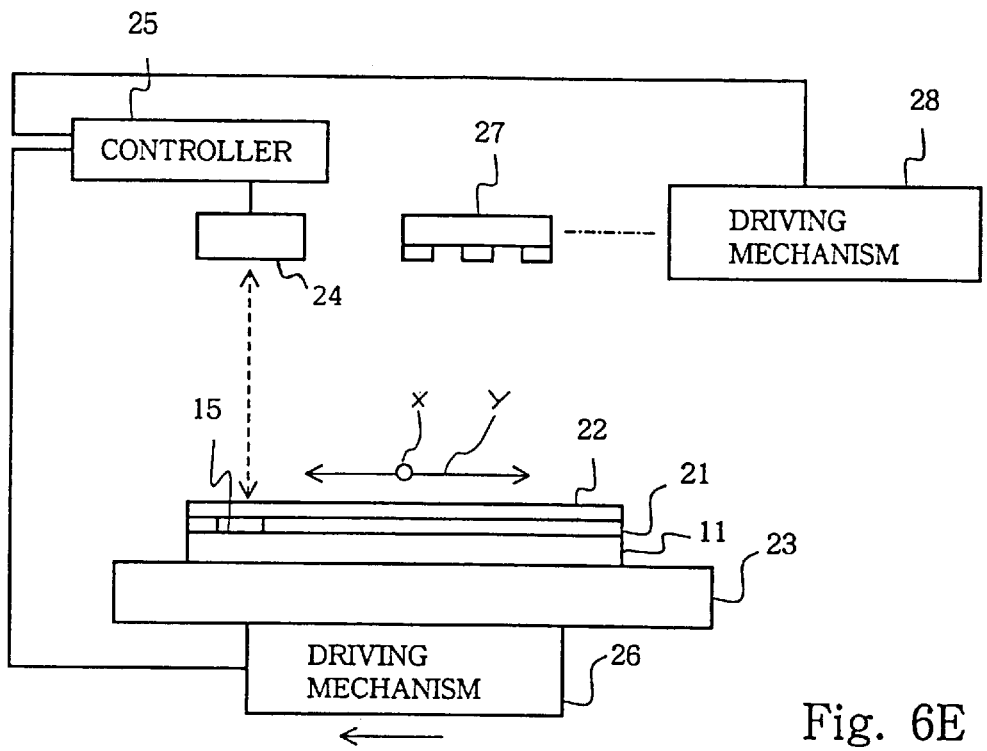

The controller 25 determines the location of a wide area in the photo resist layer 22, and instructs a driving mechanism 26 connected to the stage 23 to align a photo mask 27 with the wide area as shown in FIG. 6E. The wide area is corresponding to an image field FD3, and the image field FD3 is superimposed on the pattern in the pair of image fields FD1/FD2 as shown in FIG. 7. The pair of image fields FD1/FD2 is perfectly enclosed with the periphery of the image field FD3.

Figure 6F:
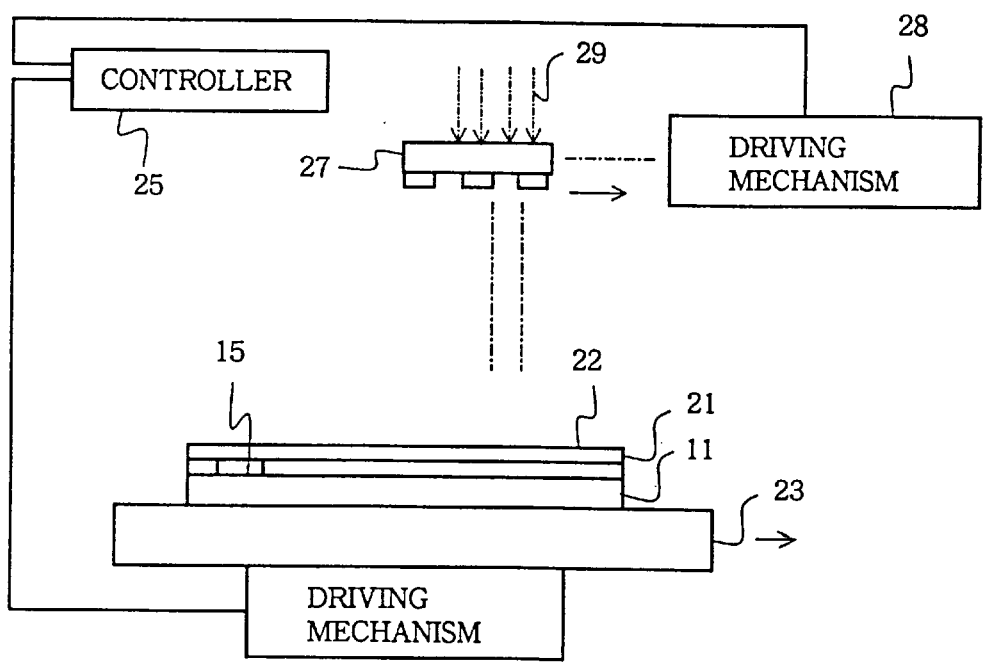

The controller 25 instructs a KrF excimer laser source (not shown) to radiate an excimer laser beam 29 through the photo mask 27 onto the wide area and the driving mechanism 26 and another driving mechanism 28 to synchronously move the stage 23 and the photo mask 27 at a certain velocity appropriate for the reduction ratio. The KrF excimer laser beam 29 transfers a pattern image from the photo mask 27 to the wide area in the photo resist layer 22 as shown in FIG. 6F, and forms a latent image in the wide area. The latent image is exactly superimposed on the pattern already formed in the area the semiconductor wafer corresponding to the pair of image fields FD1/FD2.

The manufacturer repeats the sequence having the wafer alignment using the alignment mark 15 (see FIG. 6E) and the pattern transfer (see FIG. 6F), and the wide areas are obliquely arranged in the y-direction due to the incorrect orthogonal coordinates x-y. The wide areas are corresponding to the image fields FD3' as shown in FIG. 7.

When the latent images are formed over the photo resist layer 22, the manufacturer takes the semiconductor wafer 11 from the scanning reduction projection aligner, and the photo resist layer 22 is baked. The latent images are developed in appropriate developing solution, and a photo resist layer is formed into a photo resist mask. Using the photo resist mask, the manufacturer etches the target layer 21 or ion implants dopant impurity into the target layer, by way of example.

As will be appreciated form the foregoing description, the stepping reduction projection aligner carries out the wafer alignment using the alignment mark at every other pattern transfer, and eliminates the offset due to the incorrect orthogonal coordinates from adjacent two image fields FD1/FD2 or FD1'/FD2'. On the other hand, the scanning reduction projection aligner carries out the wafer alignment using the alignment mark at every pattern transfer, and the images fields FD3/FD3' are superimposed on the pairs of image fields FD1/FD2 and FD1'/FD2'. As a result, the pattern formed through the stepping reduction projection aligner is exactly overlapped with the pattern formed through the scanning reduction projection aligner.

Second Embodiment

Figure 8:
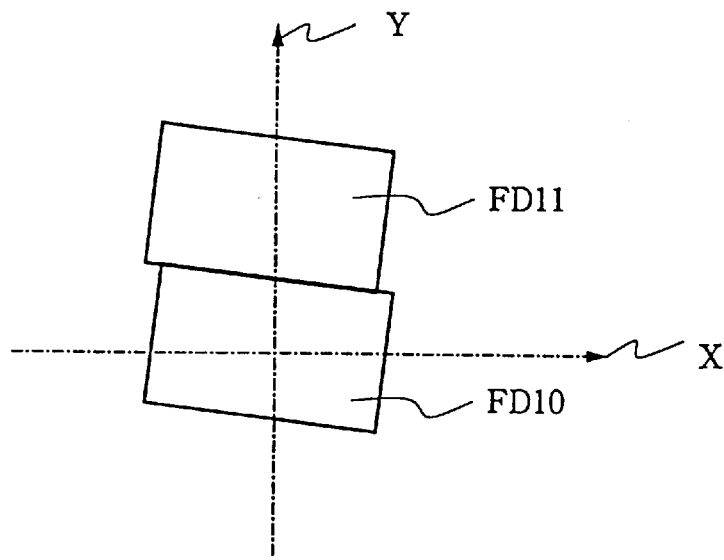
FIG. 8 is a view showing two image fields offset from each other due to a wafer rotation.
Figure 9:
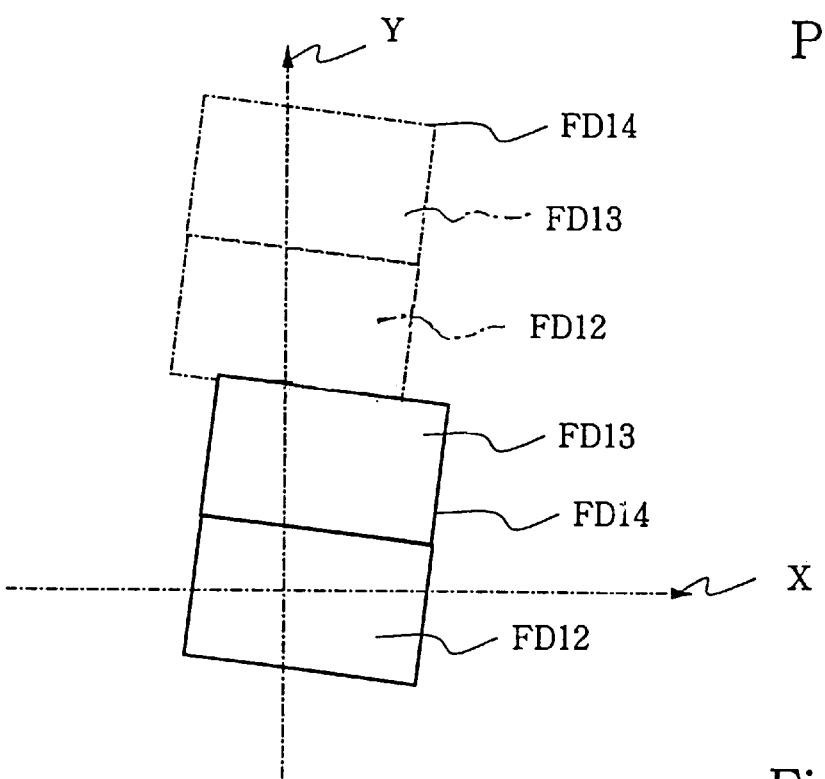
FIG. 9 is a view showing two image fields transferred by using a mix-and-match exposure system according to the present invention.

FIG. 8 illustrates two narrow image fields FD10/FD11 offset from each other due to a wafer rotation. The prior art stepping reduction projection aligner transfers each of the narrow image fields FD10/FD11 after the wafer alignment using a alignment mark.

The method for transferring pattern images according to the present invention effective against the offset due to the wafer rotation. The stepping reduction projection aligner carries out a wafer alignment using an alignment mark, and transfers a pattern image from a reticle to a narrow area of a photo resist layer corresponding to an image field FD12. The stepping reduction projection aligner calculates the location of the next narrow area without the detection of the alignment mark, and aligns the reticle with the next narrow area corresponding to an image field FD13. The image field FD13 is exactly continued to the image field FD12 without offset. The pattern image is transferred from the reticle to the next narrow area.

After an etching or an ion-implantation, the scanning reduction projection aligner carries out a wafer alignment using the alignment mark, and a pattern image is transferred from a photo mask to a wide area in another photo resist layer corresponding to an image field FD14. The pair of images fields FD12/FD13 is exactly enclosed with the periphery of the image field FD14.

Thus, the method according to the present invention is effective against the offset due to the wafer rotation.

Although particular embodiments of the present invention have been shown and described, it will be apparent to those skilled in the art that various changes and modifications may be made without departing from the spirit and scope of the present invention.

For example, a wide image field may be transferred to a photo resist layer before pattern transfer of narrow image fields. In this instance, the steps shown in FIGS. 6E and 6F are firstly carried out, and, thereafter, the steps shown in FIGS. 6A to 6D follow.

The pattern transfer apparatus are never limited to the stepping reduction projection aligner and the scanning reduction projection aligner.

If an aligner has a wide image field more than twice wider than a narrow image field of another aligner, the wafer alignment is carried out once more than two pattern transfers, and more than two narrow image fields are exactly enclosed with a periphery of a wide image field. In other words, the present invention is never limited to the image field FD3 twice wider than the image field FD1/FD2.

What is claimed is:

1. A method for transferring pattern images onto photo sensitive layers over a semiconductor wafer, comprising the steps of:

a) placing said semiconductor wafer covered with a first photo sensitive layer on a first stage opposed to a first photo mask both incorporated in a first pattern transfer apparatus having a narrow image field;

b) aligning a first narrow area of said first photo sensitive layer with said first photo mask by using an alignment mark stationary with respect to said semiconductor wafer;

c) transferring a first pattern image from said first photo mask to said first narrow area;

d) aligning a second narrow area of said first photo sensitive layer contiguous to said first narrow area without said alignment mark;

e) transferring said first pattern image from said first photo mask to said second narrow area;

f) repeating said step d) and said step e), if necessary;

g) preparing a second photo sensitive layer over said semiconductor wafer;

h) placing said semiconductor wafer on a second stage opposed to a second photo mask both incorporated in a second pattern transfer apparatus having a wide image field;

i) aligning a wide area of said second photo sensitive layer located over said first and second narrow areas with said second photo mask by using said alignment mark; and j) transferring a second pattern image from said second photo mask to said wide area so that said second pattern image is superimposed on the pair of first pattern images transferred in said steps c) and e).

2. The method as set forth in claim 1, in which said first pattern transfer apparatus and said second pattern transfer apparatus are a stepping aligner for transferring said first pattern image to each of said first and second narrow areas without a relative motion between said first photo mask, said semiconductor wafer and a photo radiation passing through said first photo mask and a scanning aligner for transferring said second pattern image to said wide area during a relative motion of a combination said second photo mask and said second photo mask and a photo radiation passing through said second photo mask, respectively.

3. The method as set forth in claim 2, in which said stepping aligner and said scanning aligner reduce said first pattern image and said second pattern image from said first photo mask and said second photo mask to said first and second narrow areas and said wide area, respectively.

4. The method as set forth in claim 1, in which said step a) to said step f) are repeated predetermined times, and said step i) and said step j) are repeated said predetermined times in such a manner that plural sets of said first and second narrow areas and plural wide areas are contiguous in said first photo sensitive layer and said second photo sensitive layer, respectively.

5. The method as set forth in claim 4, in which the first narrow areas of said plural sets, the second narrow areas of said plural sets and said plural wide areas are located in orthogonal coordinates virtually determined over said semiconductor wafer, wherein said sets of said first and second narrow areas are offset from one another in a direction parallel to one of the axes of said orthogonal coordinates due to incorrect perpendicularity between said axes, and said plural wide areas are offset from one another in said direction due to said incorrect perpendicularity.

6. The method as set forth in claim 4, in which said first narrow areas of said sets, said second narrow areas of said sets and said plural wide areas are located in orthogonal coordinates virtually determined over said semiconductor wafer, wherein said sets of said first and second narrow areas are offset from one another due to a wafer rotation, and said plural wide areas are offset from one another due to said wafer rotation.

7. The method as set forth in claim 1, in which said step g) to said step j) are carried out before said step a).

* * * * *